United States Patent
Kashimoto et al.

(10) Patent No.: US 6,285,539 B1
(45) Date of Patent: Sep. 4, 2001

(54) SWITCH DRIVER

(75) Inventors: Koji Kashimoto; Tomonori Tsuchiyama; Kazutaka Saito, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/481,405

(22) Filed: Jan. 12, 2000

(30) Foreign Application Priority Data

Jul. 13, 1999 (JP) .................................................. 11-199419

(51) Int. Cl.$^7$ ...................................................... H02H 3/00
(52) U.S. Cl. ............................................. 361/101; 323/908
(58) Field of Search ........................ 363/59, 60; 323/303, 323/299, 282, 901, 905, 908; 361/100, 101

(56) References Cited

U.S. PATENT DOCUMENTS 4,107,595 * 8/1978 Campe ................................. 318/696

FOREIGN PATENT DOCUMENTS 5344564   12/1993   (JP) .

* cited by examiner

*Primary Examiner*—Peter S. Wong
*Assistant Examiner*—Pia Tibbits
(74) *Attorney, Agent, or Firm*—Leydig, Voit & Mayer, Ltd.

(57) ABSTRACT

In a switch driver, a pnp transistor turns ON or OFF the passage of the charging current. Resistors are commonly connected to a base of the pnp transistor. Npn transistors are provided in such a way that their collectors are connected to each of the resistors and their emitters are grounded. Bases of each of npn transistors are connected to a control unit. This control unit subsequently turns ON each of the npn transistors so that a base current required for turning ON the pnp transistor flows. Since the base current rises slowly, an abrupt rise of the switching current in a switch driver can be prevented.

4 Claims, 6 Drawing Sheets

SWITCH DRIVER

FIELD OF THE INVENTION

The present invention relates to a switch driver for controlling driving of a switch for controlling a charging current with respect to a secondary battery or the like. More particularly, this invention relates to a switch driver which can prevent overshooting which accompanies an abrupt rise of current upon operation of the switch.

BACKGROUND OF THE INVENTION

In recent years, apparatuses that use a secondary battery are increasing in number. This is due to the fact that the communication apparatus represented by a laptop personal computer are becoming more and more smaller, lighter and therefore portable. A secondary battery is charged in the following manner. A charge remaining in the secondary battery is detected and a control is carried out for sequentially charging based on this remaining charge.

Figure 7:
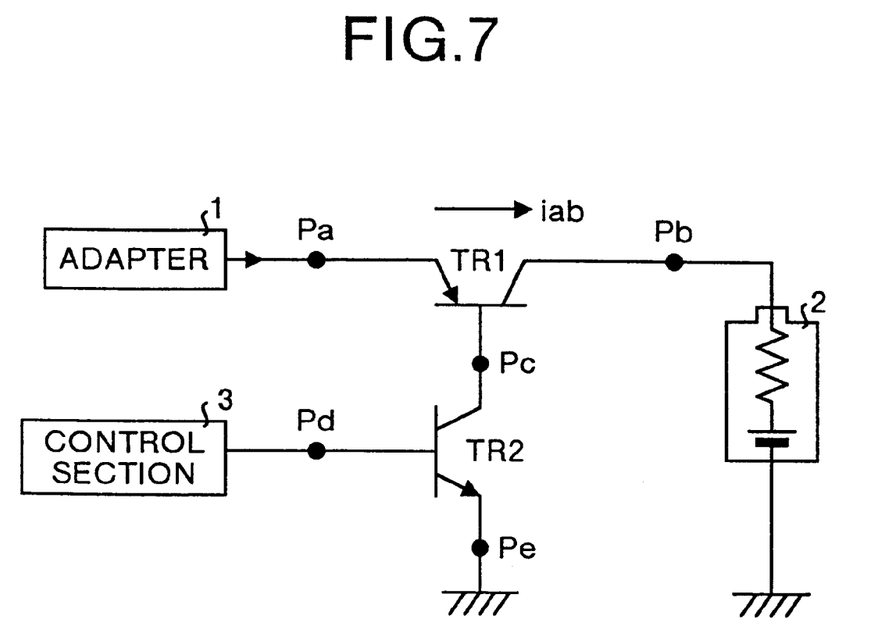
FIG. 7 is a block diagram showing a structure of the charge control system in which the conventional switch driver is applied.

FIG. 7 is a block diagram showing a structure of a switch driver in a conventional charge control system. As shown in FIG. 7, a collector of a pnp transistor TR1 is connected to an adapter 1 via a node Pa while an emitter thereof is connected to a plus terminal of a secondary battery 2 via the node Pb. Furthermore, a base of the pnp transistor TR1 is connected to a collector of the pnp transistor TR2 via the node Pc while an emitter of an npn transistor TR2 is grounded via a node Pe. A control section 3 is connected to a base of the npn transistor TR2 via a node Pd.

The control section 3 supplies a current to the base of the npn transistor TR2 to turn ON the npn transistor TR2 with the result that a current flows from the collector of the npn transistor TR2 to the emitter thereof. When the current flows with the turning ON of the npn transistor TR2, a base current of the pnp transistor TR1 increases, and the pnp transistor TR1 is turned ON with the result that a charging current iab flows to the secondary battery 2 from the adapter 1 and the secondary battery 2 is charged.

On the other hand, unless the control section 3 supplies a current to the base of the npn transistor TR2, the npn transistor TR2 is maintained in an OFF state with the result that the current does not flow from the collector of the npn transistor TR2 to the emitter thereof. As a consequence, the base current of the pnp transistor TR1 does not flow, and the pnp transistor TR1 is maintained in the OFF state with the result that the charging current iab does not flow from the adapter 1 to the secondary battery 2. The ON and OFF state of the pnp transistor TR1 is controlled with the ON and OFF control of the npn transistor TR2 by the control section 3, with the result that the charging of the secondary battery 2 by the charging current iab can be controlled with the ON and OFF thereof.

However, in the conventional switch driver described above, since the potential of the node Pc falls all of a sudden to a level that is nearly the grounding level because of the turning ON of the npn transistor TR2, the base current of the pnp transistor TR1 also flows all of a sudden. As a consequence, the charge current iab which flows through the pnp transistor TR1 abruptly increases and the charging current iab is overshot due to a transition phenomenon and the pnp transistor also vibrates largely.

Generally, in a charge control system that uses such a switch driver, a terminal voltage and a charging current iab of the secondary battery 2 are detected in order to protect the secondary battery 2. When over-voltage or over-current is detected, then an operation for dealing with an unusual state, namely suspension of charging, is carried out. However, when the overshooting described above is generated then there is a problem that the charge control system erroneously detects that an over-current has generated with the result that a normal charging operation is hindered.

SUMMARY OF THE INVENTION

The present invention has been made in view of the aforementioned problems. It is an object of the present invention is to obtain a switch driver which eliminates an abrupt rise of switching in the switch driver which is used in a charge control system or the like, the switch driver being capable of preventing in advance an erroneous operation of the system due to this abrupt rise of the switching.

According to a first aspect of the present invention, when the pnp transistors are turned ON, the control unit subsequently turns ON the plurality of the npn transistors, and the base of the pnp transistor is grounded via a resistor connected in series to each of the npn transistors by the subsequent turning ON of the npn transistors one by one. As a consequence, a voltage between the base of the npn transistor and the grounding is subsequently allowed to fall with a synthesized resistance of each of the resistors which are arranged in parallel. Finally, the voltage is allowed to fall by a parallel arrangement portion of the resistance of all the resistors, and the base potential of the pnp transistor reaches approximately the grounding level and the pnp transistor is turned ON. Since the base potential of the pnp transistor is allowed to fall subsequently, it never happens that the base current of the pnp transistor abruptly increases. Thus, it never happens that the object current which flows through the pnp transistor is prevented from being overshot, either.

According to a second aspect of the present invention, when the pnp transistor is turned ON, the control unit subsequently turns ON the plurality of the npn transistors with the result that a current corresponding to a size of each of the npn transistor is allowed to flow between the pnp transistor and the grounding with the subsequent turning ON of the npn transistors. Then the base current of the pnp transistor is gradually increased thereby preventing an abrupt increase in the base current of the pnp transistor and preventing the object current from being overshot which is allowed to flow through the pnp transistor.

According to a third aspect of the present invention, when the pnp transistor is turned ON, the base current of the pnp transistor begins to flow through the plurality of third npn transistors which are connected in series for carrying out a diode operation by the control unit turning ON the first npn transistor. However, a voltage is present between the base and the emitter of each of the third npn transistor connected in series, and the base potential of the pnp transistor does not reach the grounding level. After that, the control unit subsequently turns ON each of the second npn transistor connected in parallel to each of the third npn transistor thereby decreasing a voltage fall of the third npn transistor and allowing the base potential of the pnp transistor to come close to the grounding level and gradually increasing the base current of the pnp transistor. Thus, an abrupt increase in the base current of the pnp transistor is prevented, and the object current which flows through the pnp transistor is prevent ed from being overshot.

According to a forth aspect of the present invention, when the pnp transistor is turned ON, the base current of the pnp transistor begins to flow through a plurality of resistors which are connected in series by the control unit turning ON of the first npn transistor. However, since a voltage fall of the plurality of resistors connected in series is present, the base potential of the pnp transistor does not reach the grounding level. After that, the control unit subsequently turns ON each of the second npn transistors connected in parallel to each of the resistors, decreases a voltage fall by each of the resistors, and allows the base current of the pnp transistor to gradually increase with the result that the base current of the pnp transistor is prevented from abruptly increasing and the object current which flows through the pnp transistor is prevented from being overshot.

According to a fifth aspect of the present invention, when the pnp transistor is turned ON, the control unit subsequently turns ON a switch of the power source circuit, allows a current to flow to a base of the npn transistor from a current source which is connected in series to each of the switches, and gradually increases the base current of the npn transistor with the result that the base current of the pnp transistor is prevented from increasing abruptly, and the object current which flows through the pnp transistor is prevented from being overshot.

According to a sixth aspect of the present invention, when the pnp transistor is turned ON, the control unit applies a repetition pulse to the base of the second npn transistor, and an electric load supplied from the supply source is accumulated in the capacitor at the time of turning OFF this repetition pulse. The terminal voltage of the capacitor increases with this accumulation of the electric load. As a consequence, the base potential of the first npn transistor gradually increases thereby preventing the base current of the pnp transistor from abruptly increasing and preventing the object current which flows through the pnp transistor from being overshot.

Other objects and features of this invention will become apparent from the following description with reference to the accompanying drawings.

DESCRIPTION OF THE PREFERRED EMBODIMENTS

Preferred embodiments of the present invention will be explained in detail by referring to the accompanied drawings hereinbelow.

Figure 1:
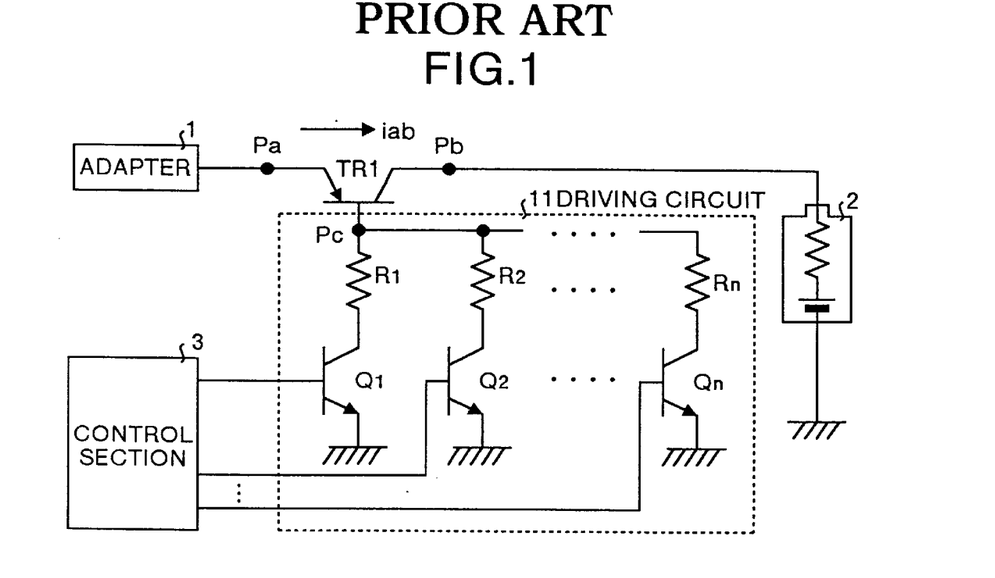
FIG. 1 is a block diagram showing a structure of a charge control system in which a switch driver according to a first embodiment of the present invention is applied.

To begin with, a first embodiment of the present invention will be explained. FIG. 1 is a block diagram showing a structure of a charge control system in which a switch driver according to the first embodiment is applied. As shown in FIG. 1, a collector of a pnp transistor TR1 is connected to an adapter 1 via a node Pa. An emitter of the pnp transistor TR1 is connected to a plus terminal of a secondary battery 2 via the node Pb. Minus terminal of the secondary battery 2 is grounded.

One end of each of a plurality (n in number) of resistors R1 through Rn is commonly connected to a base of the pnp transistor TR1. Collectors of n npn transistors Q1 through Qn are connected to the other end of each of the resistors R1 through Rn corresponding to each of the resistors R1 through Rn. Furthermore, an emitter of each of npn transistors Q1 through Qn is grounded. In other words, each of the resistors R1 through Rn and npn transistors Q1 through Qn which are connected in series to each other are connected in parallel to each other and are connected to the base of the pnp transistor TR1. These resistors R1 through Rn and npn transistors Q1 through Qn constitute a driving circuit 11.

A control section 3 is connected to the base of each of the transistors Q1 through Qn. In the case where the secondary battery 2 is charged, a control is carried out for subsequently turning ON each of the transistors Q1 through Qn. For example, the control section 3 turns ON npn transistor Q1 in accordance with an instruction of the start of charging so that a voltage fall between the base and the grounding of the pnp transistor TR1 is limited to a portion of the resistor R1. While the ON state of this npn transistor Q1 is maintained, the npn transistor Q2 is set in the ON state, and a voltage fall between the base of the pnp transistor TR1 and the grounding is limited to a portion of parallel resistance of the two resistors R1 and R2.

In a similar manner, npn transistors Q3 through Qn are subsequently turned ON, and finally, the voltage fall between the base of the pnp transistor TR1 and the grounding is set as a voltage fall in the parallel resistance portion of the resistors R1 through Rn. In other words, the control section 3 functions in such a manner that a voltage fall between the base of the pnp transistor TR1 and the grounding does not become large abruptly.

As the control section 3 forcefully and subsequently turns ON the npn transistors Q1 through Qn, the potential at the node Pc of the pnp transistor TR1, namely the base potential gradually decreases. When all the npn transistors Q1 through Qn are turned ON, a base current which flows from the base of the pnp transistor TR1 to the grounding is set to a predetermined value, and a value of charging current iab which flows from the adapter 1 to the secondary battery 2 is controlled to a predetermined value with this base current.

In this case, since the base potential of the pnp transistor TR1 decreases progressively, the base current does not flow abruptly. As a consequence, the pnp transistor TR1 does not rise abruptly, and the overshooting of the charging current iab at the time of the start of charging is not generated. Incidentally, the ON control with respect to each of the npn transistors Q1 through Qn by the control section 3 described above can be realized by, for example, incorporating a delay timer in the control section 3. By corresponding this incorporated delay timer with the clock numbers each of the npn transistors Q1 through Qn may be turned ON.

Incidentally, in the case where the charge current iab is to be prevented from flowing, the control section 3 raises the base potential of the pnp transistor TR1 with the turning ON of the npn transistors Q1 through Qn with the result that the pnp transistor TR1 is turned OFF.

Furthermore, in the first embodiment described above, all the npn transistors Q1 through Qn are turned ON to control the base current of the pnp transistor TR1 to a predetermined value and to control the base current of the pnp transistor TR1 to a predetermined value with this base current. However, the control section 3 need not turn ON all the npn transistors Q1 through Qn, but may turn ON only a predetermined number of the npn transistors out of the npn transistors Q1 through Qn, for example, three npn transistors Q1 through Q3 to control the base current of the pnp transistor TR1. Then, the control section 3 may carry out a control to limit the value of the charging current iab in a linear manner with the control of this base current. Also, in this case, an abrupt rise in the charging current iab is prevented because the npn transistors Q1 through Q3 are subsequently turned ON.

Incidentally, in the first embodiment described above, since resistors R1 through Rn are intervened between the base of the pnp transistor TR1 and the grounding, the pnp transistor TR1 can be protected.

According to the first embodiment, the resistors R1 through Rn connected in series to the npn transistors Q1 through Qn are subsequently intervened between the base of the pnp transistor TR1 and the grounding by the control section 3 subsequently turning ON the npn transistors Q1 through Qn. Then, owing to a voltage fall in the portion of parallel resistance of these resistors R1 through Rn, the base current of the npn transistor TR1 increases along with the turning ON of the pnp transistors Q1 through Qn, and, then, the charging current iab flows corresponding to the base current with the result that the generation of the overshooting caused by an abrupt rise of the charging current is prevented, an erroneous detection such as the detection of the over-current of the charging current iab is prevented in advance which detection is caused by the overshooting, and a normal operation of the charge control system can be maintained.

Figure 2:
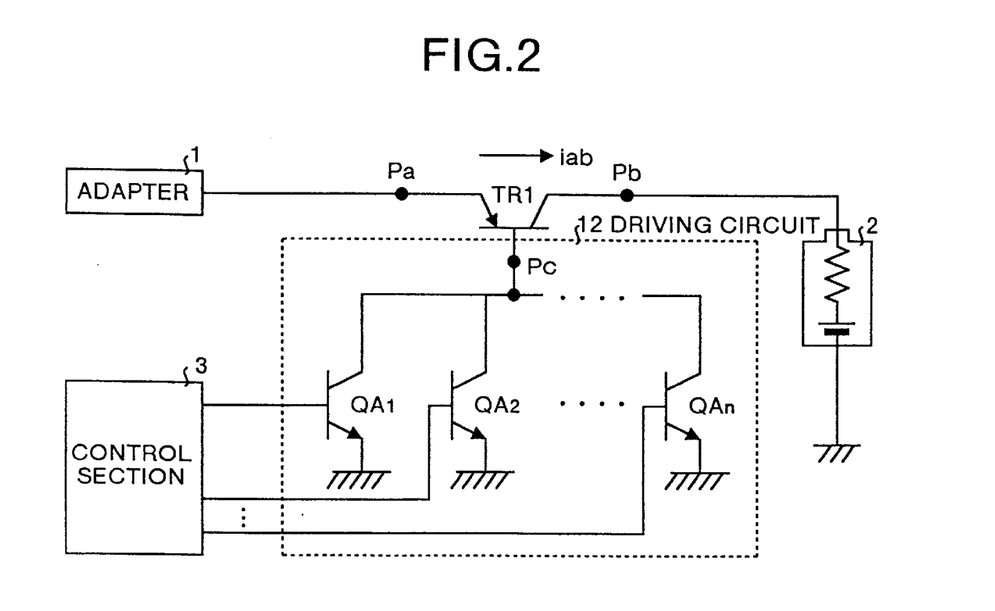
FIG. 2 is a block diagram showing a structure of the charge control system in which the switch driver according to a second embodiment of the present invention is applied.

Next, a second embodiment of the present invention will be explained. In the first embodiment, the resistors R1 through Rn connected in parallel are commonly connected to the base of the pnp transistor TR1. With the subsequent turning ON of the npn transistors Q1 through Qn, a voltage fall in the parallel resistance portion of these resistors R1 through Rn is generated. However, in the second embodiment, the resistors R1 through Rn are not provided, and the base current of the pnp transistor TR1 is controlled with the proper characteristics of the npn transistors Q1 through Qn.

FIG. 2 is a block diagram showing a structure of a charge control system in which the switch driver according to the second embodiment of the present invention is applied. A structure of the second embodiment shown in FIG. 2 is constituted in such a manner that the resistors R1 through Rn in the driving circuit 11 according to the first embodiment shown in FIG. 1 are eliminated, and npn transistors QA1 through QAn correspond to npn transistors Q1 through Qn. Other constitution of the second embodiment shown in FIG. 2 is the same as the first embodiment. Like constitutional parts are provided with the same reference numerals.

As shown in FIG. 2, the control section 3 is connected to the base of each of npn transistors QA1 through QAn. In the case where the secondary battery 2 is to be charged, a control is carried out so that each of npn transistors QA1 through QAn is subsequently turned ON. For example, the control section 3 turns ON npn transistors QA1 in accordance with an instruction of the start of the charging, and a current permitted by the npn transistor QA1 is allowed to flow between the base of the pnp transistor TR1 and the grounding. While the ON state of the npn transistor QA1 is maintained, the npn transistor QA2 is turned ON, and a current permitted by the npn transistors QA1 and QA2 is allowed to flow between the base of the pnp transistor TR1 and the grounding.

In a similar manner, the npn transistors QA3 through QAn are subsequently turned ON, and finally, a current permitted by the npn transistors QA1 through QAn is allowed to flow between the base of the pnp transistor TR1 and the grounding.

By the control section 3 subsequently turning ON by force the npn transistors QA1 through QAn, a base current corresponding to a sum of a value of the current which is allowed to flow by each of the npn transistors QA1 through QAn which is turned ON is allowed to a node Pc of the pnp transistor TR1. Consequently, the base current of the pnp transistor TR1 does not increase abruptly and hence the charging current iab which flows through the pnp transistor TR1 is prevented from being overshot with this base current.

Incidentally, the ON control with respect to each of the npn transistors QA1 through QAn by the control section 3 described above can be realized by, for example, incorporating a delay timer in the control section 3. By corresponding this incorporated delay timer with the clock numbers each of the npn transistors QA1 through QAn may be turned ON.

Furthermore, in the case where the charging current iab is not allowed to flow, the control section 3 raises the base potential of pnp transistor TR1 by the turning OFF of the npn transistors QA1 through QAn.

Incidentally, in the second embodiment described above, all the npn transistors QA1 through QAn are turned ON so that the base current of the pnp transistor TR1 is controlled to a predetermined value, and the charging current iab is controlled to a predetermined value with the base current. However, the control section 3 need not turn ON all the npn transistors QA1 through QAn, but may turn ON only a predetermined number of the npn transistors QA1 through QAn, for example, three npn transistors QA1 through QA3 so that the base current of the pnp transistor TR1 is controlled. Then, the control section 3 may carry out a control to limit the value of the charging current iab in a linear manner with the control of this base current. Also, in this case, an abrupt rise in the charging current iab is prevented because the npn transistors QA1 through QA3 are subsequently turned ON.

According to the second embodiment, the control section 3 subsequently turns ON the npn transistors QA1 through QAn with the result that the base current of the pnp transistor TR1 is gradually increased via the npn transistors QA1 through QAn. Then, since the charging current iab flows corresponding to this base current, the generation of overshooting is prevented which is caused by the abrupt rise of the charging current iab, and an erroneous detection such as the detection of the over-current is prevented in advance which detection is caused by overshooting, and a normal operation of the charge control signal can be maintained.

Figure 3:
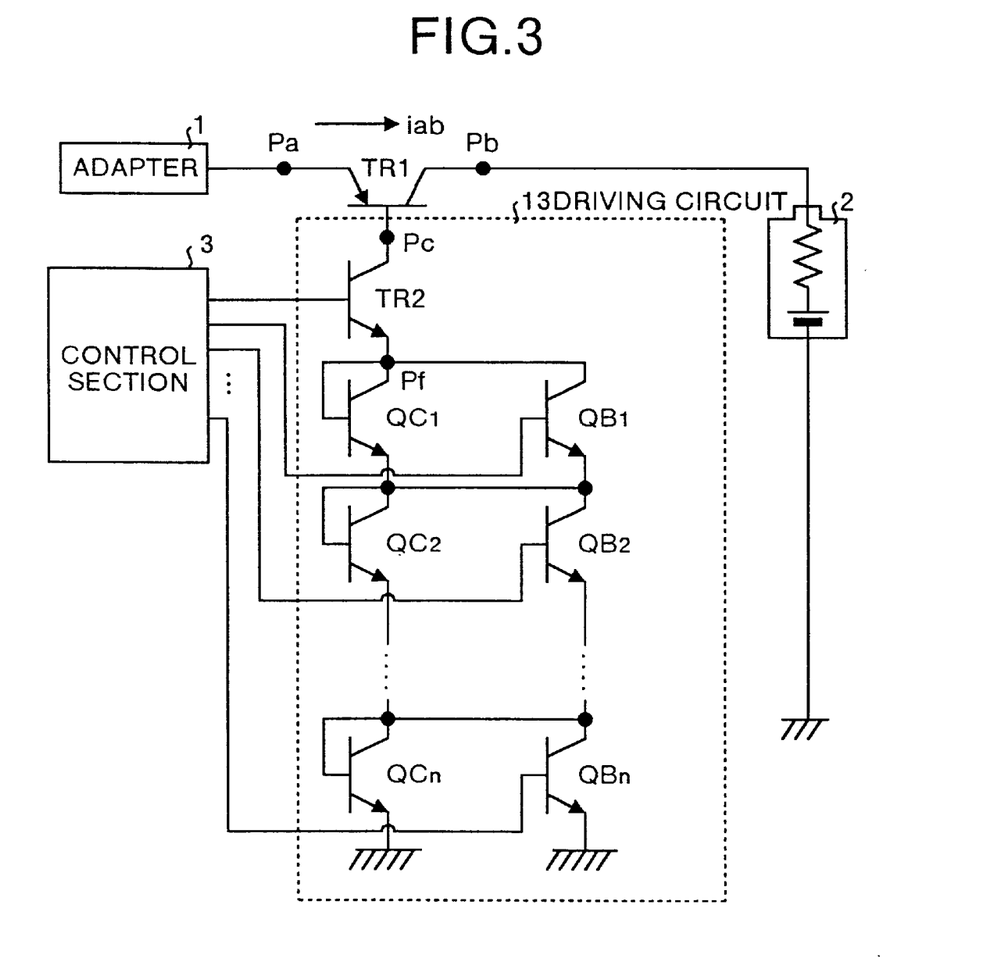
FIG. 3 is a block diagram showing a structure of the charge control system in which the switch driver according to a third embodiment of this invention is applied.

Next, a third embodiment of the present invention will be explained. In both Embodiments 1 and 2, an abrupt increase in the base current of the pnp transistor TR1 is controlled by the subsequent turning ON of the npn transistors Q1 through Qn or the npn transistors QA1 through QAn which are connected in parallel to the base of the pnp transistor TR1. However, in the third embodiment, basically, the npn transistors connected in series are connected to the base of the pnp transistor TR1. Then an abrupt fall of the base potential of the pnp transistor TR1 is prevented by the subsequent turning ON of each of the npn transistors. As a consequence, an abrupt increase in the base current is prevented by such a procedure.

FIG. 3 is a block diagram showing a structure of a charge control system in which the switch driver according to the third embodiment of the present invention is applied. The structure of the third embodiment shown in FIG. 3 is the same except for the structure of the driving circuit 11 according to the first embodiment shown in FIG. 1. Like constitution parts are provided with same reference numerals.

The driving circuit 13 shown in FIG. 3 has an npn transistor TR2 having a collector thereof connected to the base of the pnp transistor TR1, collectors of npn transistors QC1 and QB1 connected in parallel are commonly connected to the emitter of the npn transistor TR2, and furthermore, collectors of npn transistors QC1 and QB1 connected in parallel are commonly connected to the emitter of npn transistors QC1 and QB1. In a similar manner, each of the transistor pairs of npn transistors QC3 through QCn and QB2 through QBn are subsequently connected in series, and the emitters of the npn transistors QCn and QBn are grounded.

In other words, the npn transistors QC1 through QCn and QB1 through QBn constitute n transistor pairs connected in parallel respectively. With n transistor pairs connected in series, the collector of npn transistor TR2 and the grounding is connected. Incidentally, each of the collectors and each of the bases of the npn transistors QC1 through QCn are short-circuited respectively. Furthermore, each of the bases of the npn transistors QB1 through QBn is connected to the control section 3.

In the case where the secondary battery 2 is charged, the control section 3 applies a voltage to the base of the npn transistor TR2 to turn ON. Here, since the collector and the base of each of the npn transistors are short-circuited, each of the npn transistors QC1 through QCn operates as a diode which exists between the base and the emitter of each of the npn transistors QC1 through QCn.

Consequently, the base current of the pnp transistor TR1 flows to the grounding via the npn transistor TR2 and the npn transistors QC1 through QCn. In this case, a diode operation is carried out between the base and the emitter of each of the npn transistors QC1 through QCn. However, since a voltage between the base and the emitter thereof does not become zero, the base potential of the pnp transistor TR1 does not become the grounding level at once due to the turning ON of the npn transistor TR2.

After that, the control section 3 subsequently turns ON the npn transistors QB1 through QBn. In other words, the npn transistor QB1 is turned ON in the beginning so that a current is allowed to flow to the npn transistor QB1 by a transistor action. Thus, the voltage between the collector and the emitter of the transistor QC1 is allowed to approach to zero in an equivalent manner. In a similar manner, the control section 3 subsequently turns ON the npn transistor QB2 through QBn while the ON state of the npn transistor QB1 is maintained. Finally, the base potential of the pnp transistor TR1 is allowed to come close to the grounding level.

Through such a procedure, a desired base current flows to the base of the pnp transistor TR1. A predetermined value of the base current flows between the collector and the emitter of the pnp transistor TR1. In this case, since the base current of the pnp transistor TR1 gradually increases with the subsequent turning ON of the npn transistors QB1 through QBn, the charging current iab which flows through the pnp transistor TR1 is prevented from being overshot.

Incidentally, the ON control with respect to the npn transistor TR2 and each of the npn transistors QB1 through QBn by the control section 3 can be realized by incorporating a delay timer in the control section 3. By corresponding this incorporated delay timer with the clock numbers the npn transistor TR2 and each of the npn transistors QB1 through QBn may be turned ON.

Furthermore, in the case where the charging current iab is prevented from flowing, the control section 3 raises the base potential of the pnp transistor TR1 by the turning OFF of the npn transistor TR2 and the npn transistors QB1 through QBn with the result that the pnp transistor TR1 is turned OFF through such a procedure.

Incidentally, in the third embodiment described above, all the npn transistors QB1 through QBn are turned ON so that the base current of the pnp transistor TR1 is controlled to a predetermined value, and the charging current iab is controlled to a predetermined value with this base current. However, the control section 3 need not turn ON all the npn transistors QB1 through QBn but may turn ON only a predetermined number of the npn transistors out of the npn transistors QB1 through QBn, for example, three npn transistors QB1 through QB3 to control the base current of the pnp transistor TR1. Then, the control section 3 may carry out a control to limit the value of the charging current iab in a linear manner with the control of this base current. Also, in this case, an abrupt rise in the charging current iab is prevented because the npn transistors QB1 through QB3 are subsequently turned ON.

According to the third embodiment, the control section 3 subsequently increases the base current of the pnp transistor TR1 via the npn transistor TR2 and the npn transistor QB1 through QBn by the subsequent turning ON of the npn transistor TR2 and the npn transistors QB1 through QBn. Then, since the charging current iab flows corresponding to this base current, the overshooting caused by an abrupt rise of the charging current iab is prevented, an erroneous detection such as the detection of the over-current of the charging current iab is prevented in advance which detection is caused by this overshooting, and a normal operation of the charge control system can be maintained.

Figure 4:
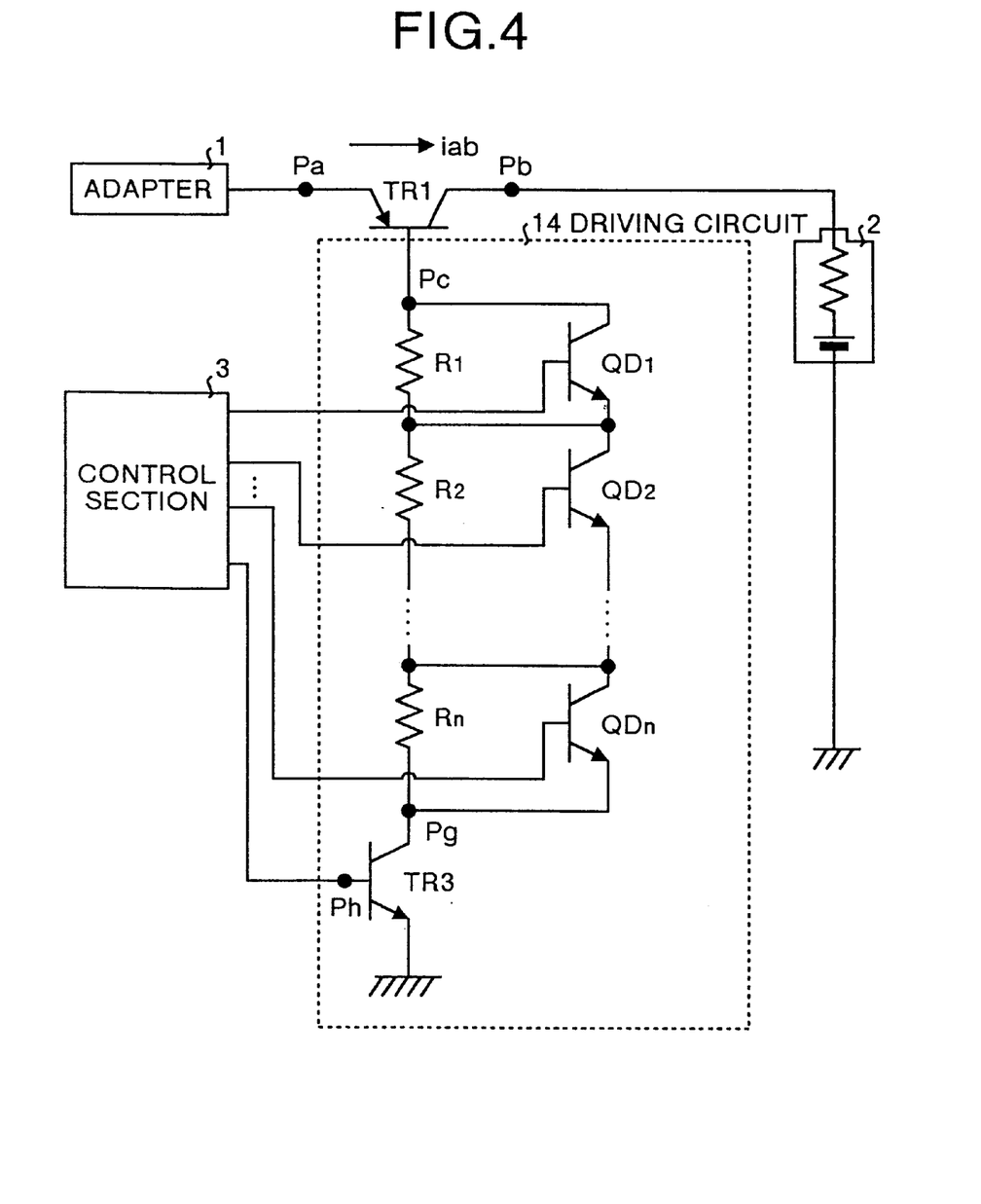
FIG. 4 is a block diagram showing a structure of the charge control system in which the switch driver according to a forth embodiment of the present invention is applied.

A fourth embodiment of the present invention will be explained. In the third embodiment described above, the base current of the pnp transistor TR1 is prevented from flowing owing to the voltage fall by the diode action of the npn transistors QC1 through QCn so that the base current of the pnp transistor TR1 is controlled to a predetermined value with the subsequent turning ON of the npn transistors QB1 through QBn. On the other hand, in the forth embodiment, the resistors R1 through Rn are provided in place of the npn transistors QC1 through QCn so that the base current of the pnp transistor TR1 is prevented from flowing abruptly owing to the voltage fall of these resistors R1 through Rn.

FIG. 4 is a block diagram showing a structure of a charge control system in which the switch driver according to the fourth embodiment of the present invention is applied. The structure of the fourth embodiment shown in FIG. 4 is the same except for the structure of the driving circuit 13 according to the third embodiment. Like constitutional parts are provided with the same reference numerals.

In the driving circuit 14 shown in FIG. 4, n number of resistors R1 through Rn are connected in series to an emitter of the pnp transistor TR1. Further, an npn transistor TR3 is provided whose collector is connected to the other end of the resistors R1 through Rn that are connected in series. Furthermore, the emitter of the npn transistor TR3 is grounded. In addition, n npn transistors QD1 through QDn are arranged in parallel in correspondence to each of the resistors R1 through Rn respectively. Furthermore, the base of the npn transistors TR 3 and each of the bases of the npn transistors QD1 through QDn are connected to the control section 3.

In the case where the secondary battery 2 is to be charged, the control section 3 applies a voltage to the base of the npn transistor TR 3 in the beginning thereby turning ON the npn transistor TR3. Then, a base current of the pnp transistor TR1 is allowed to flow to the grounding via the resistors R1 through Rn connected in series. In this case, the base voltage of the pnp transistor TR1 does not approach to the grounding level because of the presence of the voltage fall of the resistors R1 through Rn connected in series. After that, the control section 3 decreases the voltage fall of the resistors R1 through Rn with the subsequent turning ON of the npn transistors QD1 through QDn which are connected in parallel to each of the resistors R1 through Rn. Then, the base voltage of the pnp transistor approaches to the grounding level with the turning ON of all the npn transistors QD1 through QDn so that the base current is controlled to a predetermined value.

Consequently, the base current of the pnp transistor TR1 gradually increases with the subsequent turning ON of the npn transistors QD1 through QDn with the result that the base current of the pnp transistor TR1 is prevented from abruptly rising so that the charging current iab which flows through the pnp transistor TR1 can be controlled to the predetermined value free from the overshooting thereof.

Incidentally, the ON control with respect to the npn transistor TR3 and each of npn transistors QD1 through QDn by the control section 3 described above can be realized by, for example, incorporating a delay timer in the control section 3. By corresponding this incorporated delay timer with the clock numbers the npn transistor TR3 and each of the npn transistors QD1 through QDn may be turned ON.

Furthermore, in the case where the charging current iab is prevented from flowing, the control section 3 raises the base potential of the pnp transistor TR1 by the turning OFF of the npn transistor TR3 and the npn transistor QD1 through QDn with the result that the pnp transistor TR1 is turned OFF through such a procedure.

Incidentally, in the fourth embodiment described above, since the resistors R1 through Rn intervenes between the base of the pnp transistor TR1 and the grounding, the pnp transistor TR1 can be protected.

Furthermore, in the fourth embodiment described above, the base current of the pnp transistor TR1 is controlled to a predetermined value by turning ON all the npn transistors QD1 through QDn, and the charging current tab is controlled to a predetermined value with the base current. However, the control section 3 need not turn ON all the npn transistors QD1 through QDn, but may turn ON only a predetermined number of the npn transistors out of the npn transistors QD1 through QDn, for example, three npn transistors QD1 through QD3 so that the base current of the pnp transistor TR1 is controlled. Then, the control section 3 may carry out a control to limit the value of the charging current iab in a linear manner with the control of this base current. Also, in this case, an abrupt rise in the charging current iab is prevented because the npn transistors QD1 through QD3 are subsequently turned ON.

According to the fourth embodiment, the control section 3 subsequently increases the base current of the pnp transistor TR1 via the npn transistor TR3 and the npn transistors QD1 through QDn with the subsequent turning ON of the npn TR3 and the npn transistors QD1 through QDn, and the base current iab of the pnp transistor TR1 flows corresponding to the base current with the result that the generation of the overshooting caused by an abrupt rise of the charging current iab is prevented, an erroneous detection such as the detection of the over-current of the charging current iab is prevented in advance which detection is caused by this overshooting, and a normal operation of the charge control system can be maintained.

Figure 5:
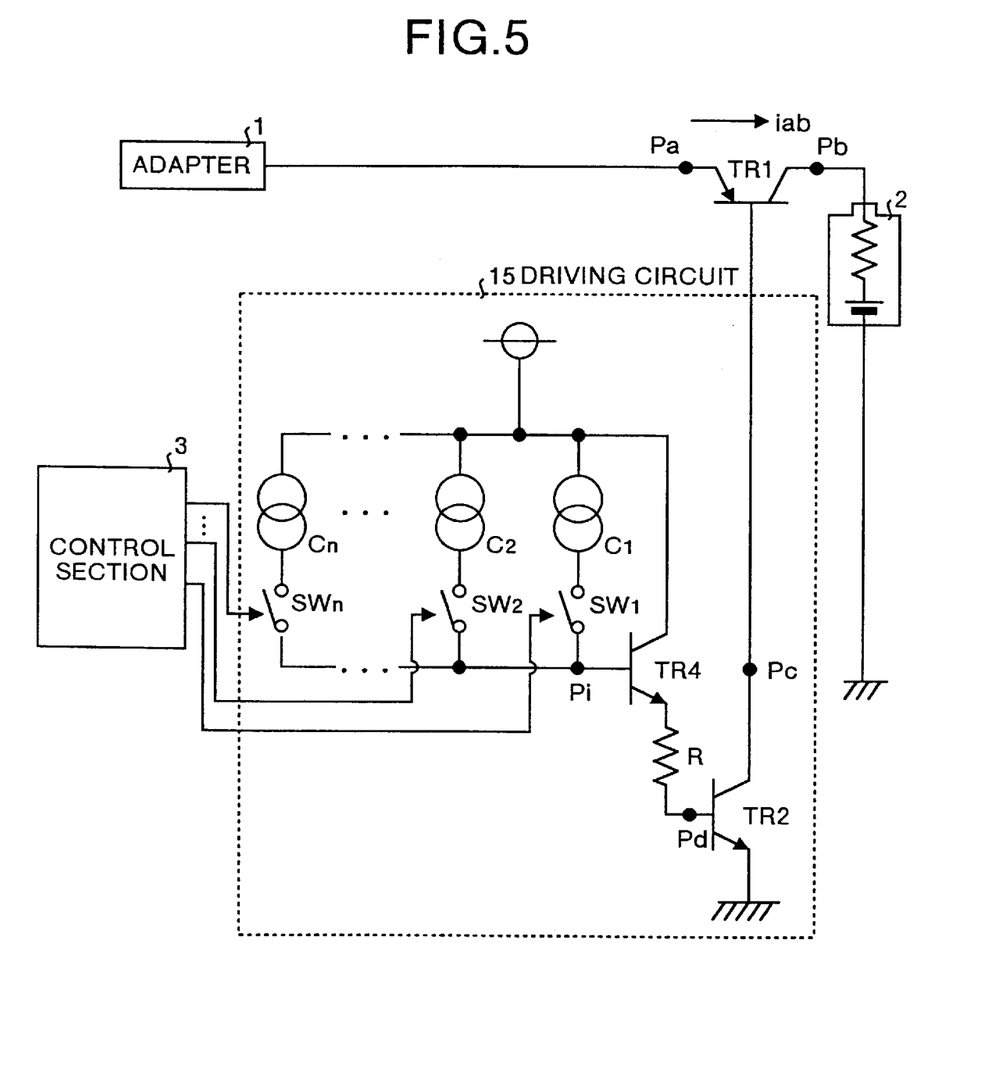
FIG. 5 is a block diagram showing a structure of the charge control system in which the switch driver according to a fifth embodiment of the present invention is applied.

Next, a fifth embodiment of the present invention will be explained. In Embodiments 1 through 4, a plurality of the npn transistors are intervened between the base of the pnp transistor TR1 and the grounding, and a control is carried out to gradually increase the base current of the pnp transistor TR1 with the subsequent turning ON of the plurality of the npn transistors. However, in the fifth embodiment, a control is carried out to gradually increase the base current of the pnp transistor TR1 by gradually increasing the base current of one npn transistor which intervenes between the base of the pnp transistor and the grounding.

FIG. 5 is a block diagram showing a structure of the charge control system in which the switch driver according to the fifth embodiment of the present invention is applied. A structure of the fifth embodiment shown in FIG. 5 is the same except for the structure of the driving circuit 14 according to the forth embodiment shown in FIG. 4. Like constitutional parts are provided with the same reference numerals.

The driving circuit 15 shown in FIG. 5 has an npn transistor TR2 connected in between the base of the pnp transistor TR1 and the grounding. The collector of the npn transistor TR2 is connected to the base of the pnp transistor TR1, and the emitter of the npn transistor TR2 is grounded. The base of the npn transistor TR2 is connected to the emitter of the npn transistor TR4 via the resistor R.

Between the collector and the base of the npn transistor TR4, n number of current sources C1 through Cn respectively having switches SW1 through SWn connected in series are connected in parallel. These current sources C1 through Cn allow the current to flow in a direction of increasing the base current of the npn transistors TR4. Furthermore, n number of switches SW1 through SWn connected in series to each of n current sources C1 through Cn are connected to the control section 3 respectively and the switch is controlled with the control section 3.

In the case where the secondary battery 2 is to be charged, the control section 3 subsequently turns ON the switches SW1 through SWn. Accordingly, a current flows to the base of the npn transistor T4 from the current source C1 through Cn connected in series to the switches SW1 through SWn which are turned ON. Consequently, the base current of the npn transistor TR 4 increases with the subsequent turning ON of the switches SW1 through SWn, and the base current of the increased npn transistor TR4 flows to the base of the npn transistor TR2 via the resistor R.

As a consequence, the base current of the pnp transistor TR1 subsequently increases corresponding to the increase in the base current of the npn transistor TR2. In other words, the base current of the pnp transistor TR1 can be controlled to a predetermined value corresponding to the subsequent turning ON of the switches SW1 through SWn by the control section 3. As a result, an abrupt increase in the base current of the pnp transistor TR1 is prevented, and the charging current iab which flows through the pnp transistor TR1 can be controlled to a predetermined value free from the overshooting thereof through such a procedure.

Incidentally, the ON control with respect to the switches SW1 through SWn by the control section 3 can be realized by, for example, incorporating a delay timer in the control section 3. By corresponding this incorporated delay timer with the clock numbers the switches SW1 through SWn may be turned ON.

Furthermore, in the case where the charging current iab is to be prevented from flowing, the control section 3 carries out to turn OFF the switches SW1 through SWn. In other words, the control section 3 turns OFF the switches SW1 through SWn to turn OFF the base current of the npn transistor TR4 with the result that the npn transistor TR2 is turned OFF to raise the base potential of the pnp transistor TR1 and turn OFF the pnp transistor TR1.

Furthermore, in the fifth embodiment described above, all the switches SW1 through SWn are turned ON so that a control is carried out to allow the current to flow from all the current sources C1 through Cn. However, the control section 3 need not turn ON all the switches SW1 through SWn, but may turn ON only a predetermined number of switches out of the switches SW1 through SWn, for example, three switches SW1 through SW3 to allow the current which flows from the current source C1 through C3 corresponding to each of the switches SW1 through SW3 as the base current of the npn transistors TR4. Then, the control section 3 may carry out a control to limit the value of the charging current iab in a linear manner with the control of this base current of the npn transistor TR2. Also, in this case, an abrupt rise in the charging current iab is prevented because the base current increases gradually.

According to the fifth embodiment, the control section 3 gradually increases the base current of the npn transistor TR2 by subsequently turning ON the switches SW1 through SWn with the result that the base current of the pnp transistor TR1 is gradually increased. Then, since the charging current iab flows corresponding to the base current, the generation of the overshooting caused by the abrupt rise of the charging current iab is prevented, and an erroneous detection such as the detection of the over-current of the charging current iab is prevented in advance which detection is caused by this overshooting, and a normal operation of the charge control system can be maintained.

Figure 6:
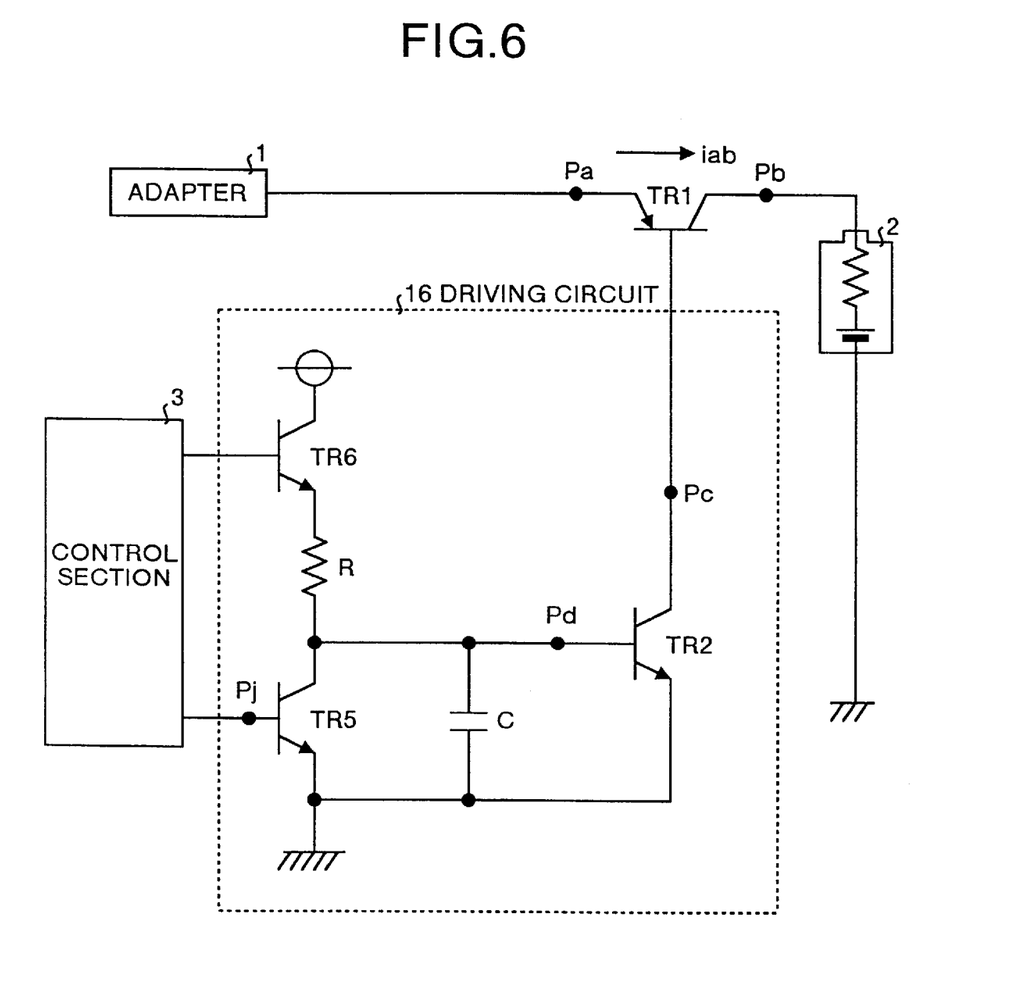
FIG. 6 is a block diagram showing a structure of the charge control system in which the switch driver according to a sixth embodiment of the present invention is applied.

Next, a sixth embodiment of the present invention will be explained. In the fifth embodiment described above, the current supplied from the current sources C1 through Cn is allowed to increase gradually with the subsequent turning ON of the switches SW1 through SWn. Then, through such a procedure, the base current of the npn transistor TR2 is allowed to increase with the increase in the current supplied from the current sources C1 through Cn. On the other hand, in the sixth embodiment, a capacitor is arranged between the base and the emitter of the npn transistor TR2 so that a control with which the npn transistor TR2 can be turned on slowly can be provided.

FIG. 6 is a block diagram showing a structure of the charge control system in which the switch driver according to the sixth embodiment of the present invention is applied. The structure of the sixth embodiment shown in FIG. 6 is the same except for the structure of the driving circuit 15 in the fifth embodiment shown in FIG. 5. Like constitution parts are provided with the same reference numerals.

The driving circuit 16 shown in FIG. 6 has an npn transistor TR2 connected in between the base of the pnp transistor TR1 and the grounding. The collector of the npn transistor TR2 is connected to the base of the pnp transistor TR1 while the emitter of the npn transistor TR2 is grounded.

Furthermore, a capacitor C and an npn transistor TR5 are provided between the base and the emitter of the npn transistor TR2. The collector of the npn transistor TR5 is connected to the base of the npn transistor TR2, the emitter of the npn transistor TR5 is connected to the emitter of the npn transistor TR2. Furthermore, the base of the npn transistor TR5 is connected to the control section 3.

Furthermore, the driving circuit 16 has an npn transistor TR6. The emitter of the npn transistor TR6 is commonly connected to the base of the npn transistor TR2, the capacitor C and the emitter terminal of the npn transistor TR5 via the resistor R. Furthermore, the collector of the npn transistor TR6 is connected to the power source, and, at the same time, the base of the npn transistor TR6 is connected to the control section 3.

In the case where the secondary battery 2 is to be charged, the control section 3 turns ON the npn transistor TR6, and, at the same time, the control section 3 applies a pulse-like voltage signal to the base of the npn transistor TR5. This pulse-like voltage signal is a pulse which cyclically repeats ON and OFF. When an ON pulse is applied to the base of the npn transistor TR5, the npn transistor TR5 is turned ON, and a current which flows from the npn transistor TR6 via the resistor R flows to the grounding via the npn transistor TR5, and an electric load is not accumulated in the capacitor C.

On the other hand, when the OFF pulse is applied to the base of the npn transistor TR5, the npn transistor TR5 is turned OFF, and an electric load of the current which flows from the npn transistor TR5 via the resistor R is accumulated in the capacitor C. The ON and OFF pulses are applied to the base of the npn transistor TR5 in a repeated manner with the result that an electric load is accumulated in the capacitor C at the time of the OFF of the pulse.

As a consequence, a voltage across the capacitor C gradually increases, and the base voltage of the npn transistor TR2 gradually increases. As a consequence, the npn transistor TR2 is gradually turned ON, and the base current of the pnp transistor TR1 gradually increases. The charging current iab of the pnp transistor TR1 which flows through the pnp transistor TR1 does not abruptly increase with a gradual increase in the base current, and the charging current iab is controlled to a predetermined value free from the overshooting.

Furthermore, in the case where the flow of the charging current iab is to be prevented from flowing, the control section 3 suspends the supply of the current by the turning OFF of the npn transistor TR6 thereby turning ON the npn transistor TR5, discharging the electric load accumulated in the capacitor C. Then, the base potential of the npn transistor TR2 is set to the grounding level with the lowering of the voltage between the terminals of the capacitor C with the result that the npn transistor TR2 is turned OFF. Then, the base potential of the pnp transistor TR1 is heightened with the turning OFF of the npn transistor TR2 and the pnp transistor TR1 is turned OFF.

Incidentally, the pulse-like signal generated by the control section 3 described above may be such that the electric load accumulated in the capacitor C by the change of the duty of ON and OFF, namely the change in the base voltage may be more minutely controlled.

According to the sixth embodiment, the voltage of the capacitor C is gradually increased with the repetition of ON and OFF by the control section 3 applying the pulse-like voltage signal to the base of the npn transistor TR5 with the result that the base voltage of the npn transistor is allowed to increase gradually. Consequently, since an abrupt increase in the base current of the pnp transistor TR1 is prevented, and the charging current iab flows in correspondence to this base current, the generation of the overshooting caused by the abrupt rise of the charging current iab, an erroneous detection such as the detection of the over-current of the charging current iab is prevented in advance which detection is caused by this overshooting, and a normal operation of the charge control system can be maintained.

As has been described above, according to the first aspect of the present invention, when the pnp transistor is turned ON, since the control unit subsequently turns ON the plurality of npn transistors, and the base of the pnp transistor is grounded via the resistors connected in series to each of the npn transistors with the subsequent turning ON of the npn transistors, a voltage fall between the base of the npn transistor and the grounding is allowed to fall subsequently with the synthesized resistance of each of the resistors connected in parallel. Finally, the voltage falls in a parallel portion resistance of all the resistors with the result that the base potential of the pnp transistor reaches approximately the grounding level, and the pnp transistor is turned ON. Since the base potential of the pnp transistor is allowed to fall subsequently at this time, the base current of the pnp transistor does not increase abruptly. Thus, the object current which flows through the pnp transistor is prevented from being overshot. As a consequence, for example, in the case where the object current is a charging current in a charge control system, a current value of the charging current is detected for the protection of the over-current or the like. However, since the charging current is prevented from being overshot at the time of the turning ON of the pnp transistor, there is provided an advantage that an erroneous detection such as a detection of the over-current of the charging current can be prevented which detection is caused by the overshooting, and a normal operation of the charge control system can be maintained.

According to the second aspect of the present invention, when the pnp transistor is turned ON, the control unit subsequently turns ON the plurality of npn transistors, and a current corresponding to a size of each of the npn transistors is allowed to flow between the pnp transistor and the grounding, and the base current of the pnp transistor is gradually increased with the subsequently turning ON of the npn transistor thereby preventing an abrupt increase in the base current of the pnp transistor and preventing the object current which flows through the pnp transistor from being overshot. As a consequence, for example, in the case where the object current is the charging current in the charge control system, a current value of the charging current is detected for the protection of the over-current of the charging current or the like. Since the overshooting is not generated at the time of the turning ON of the pnp transistor, there is provided an advantage that an erroneous detection such as the detection of the over-current can be prevented which detection is caused by the overshooting, and a normal operation of the charge control system can be maintained.

According to the third aspect of the present invention, when the pnp transistor is turned ON, the base current of the pnp transistor begins to flow through the plurality of the third npn transistors connected in series for carrying out a diode operation by the control unit subsequently turning ON a the first npn transistors. However, there is present a voltage between the base and the emitter of each of the third npn transistors connected in series so that a base potential of the pnp transistor does not reach the grounding level.

Thereafter, the control unit subsequently turns ON each of the second npn transistors connected in parallel to each of the third npn transistors, a voltage fall of each of the third npn transistors is decreased, the base potential of the pnp transistor is allowed to come close to the grounding level, and the base current of the pnp transistor is allowed to increase gradually. Thus, an abrupt increase in the base current of the pnp transistor is prevented, and the object current which flows through the pnp transistor is prevented from being overshot. As a consequence, for example, in the case where the object current is the charging current in the charge control system, the current value of the charging current is detected for the protection of the over-current or the like. However, since the overshooting is not generated at the time of turning ON of the pnp transistor, there is provided an advantage such that an erroneous detection such as the detection of the over-current of the charging current can be prevented which detection is caused by the overshooting, and a normal operation of the charge control system can be maintained.

According to the fourth aspect of the present invention, when the pnp transistor is turned ON, the base current of the pnp transistor begins to flow through a plurality of resistors connected in series due to turning ON of the first npn transistor by the control unit. Since a voltage fall of the plurality of resistors connected in series is present, the base potential of the pnp transistor does not reach the grounding level.

Thereafter, since the control unit subsequently turns ON each of the second npn transistors connected in parallel to each of the resistors, and decreases a voltage fall caused by the resistors, allows the base potential of the pnp transistor to come close to the grounding level, and allows the base current of the pnp transistor to increase gradually thereby preventing an abrupt increase in the base current of the pnp transistor, and preventing the object current which flows through the pnp transistor from being overshot, for example, in the case where the object current is the charging current in the charge control system, a current value of the charging current is detected for the protection of the over-current or the like. However, since the charging current is prevented from being overshot at the time of turning ON of the pnp transistor, there arises an advantage that an erroneous detection such as the detection of the over-current of the charging current which detection is caused by the overshooting can be prevented, and a normal operation of the charge control system can be maintained.

According to the fifth aspect of the present invention, when the pnp transistor is turned ON, the control unit subsequently turns ON the current source circuit, allows a current to flow to the base of the npn transistor from the current source connected in series to each of the switches, and gradually increases the base current of the npn transistor thereby allowing the base current of the pnp transistor to increase gradually with the result that an abrupt increase in the base current of the pnp transistor is prevented, and the object current which flows through the pnp transistor is prevented from being overshot. As a consequence, for example, in the case where the object current is the charging current in the charge control system, the current value of the charged current is detected for the protection of the over-current or the like. However, since the overshooting is not generated at the time of turning ON of the pnp transistor, there is provided an advantage such that an erroneous detection such as the detection of the over-current of the charging current can be prevented which detection is made by the overshooting, and a normal operation of the charge control system can be maintained.

According to the sixth aspect of the present invention, when the pnp transistor is turned ON, the control unit applies a repetition pulse to the base of the second npn transistor, and accumulates an electric load supplied from the supply source in the capacitor at the time when the repetition pulse is turned OFF.

The terminal voltage of the capacitor increases with the accumulation of this electric load so that an abrupt increase in the base current of the pnp transistor is prevented, and the object current which flows through the pnp transistor is prevented from being overshot. As a consequence, for example, in the case where the object current is the charging current in the charge control system, the current value of the charge current is detected for the protection of the over-current or the like. However, since the overshooting is not generated at the time of turning ON of the pnp transistor, there is provided an advantage that an erroneous detection such as the detection of the over-current of the charging current can be prevented which detection is caused by the overshooting, and a normal operation of the charge control system can be maintained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A switch driver comprising:

a pnp transistor having an emitter, a base, and a collector, for turning ON and OFF passage of an object current;

a node connected to the base of said pnp transistor;

a plurality of npn transistors having respective emitters, bases, and collectors, the collectors being connected to said node and the emitters being grounded; and a control unit to which respective bases of said plurality of npn transistors are connected for successively turning ON said plurality of npn transistors, thereby controlling a base current required for turning ON said pnp transistor.

2. The switch driver according to claim 1, including a plurality of resistors respectively connected between corresponding collectors of said plurality of npn transistors and said node.

3. A switch driver comprising:

a pnp transistor having an emitter, a base, and a collector, for turning ON and OFF passage of an object current;

a first npn transistors having an emitter, a base, and a collector, the collector being connected to the base of said pnp transistor;

a plurality of pairs of second and third npn transistors, said second and third transistors having respective emitters, bases, and collectors and being connected as a pair of transistors with the collectors of each pair of said second and third npn transistors connected to each other, the emitters of each pair of said second and third npn transistors connected to each other, and the collector and the base of said third npn transistor of each pair of said second and third transistors short-circuited, the plurality of said pairs of second and third transistors being connected in series with the collectors of said second and third npn transistors of a first pair of said pairs of transistors connected to the emitter of said first npn transistor, and the emitters of the second and third npn transistors of a last pair of said pairs of transistors being grounded; and a control unit to which the bases of said second npn transistors of said plurality of pairs of transistors are connected for turning ON said first npn transistor followed by subsequently turning ON said second npn transistors in said plurality of pairs of second and third transistors, thereby controlling a base current required for turning ON said pnp transistor.

4. A switch driver comprising:

a pnp transistor having an emitter, a base, and a collector, for turning ON and OFF passage of an object current;

an npn transistor having an emitter, a base, and a collector, the collector being connected to the base of said pnp transistor and the emitter being grounded;

a current source circuit including a plurality of pairs of current sources and switches respectively connected in series, said plurality of pairs of current sources and switches being connected in parallel for supplying a base current to the base of said npn transistor; and a control unit for successively turning ON said switches and increasing the base current to said npn transistor, thereby controlling a base current required for turning ON said pnp transistor.

* * * * *